United States Patent
Yanase

(10) Patent No.: US 12,164,224 B2
(45) Date of Patent: Dec. 10, 2024

(54) PELLICLE

(71) Applicant: Shin-Etsu Chemical Co., Ltd., Tokyo (JP)

(72) Inventor: Yu Yanase, Annaka (JP)

(73) Assignee: SHIN-ETSU CHEMICAL CO., LTD, Tokyo (JP)

( * ) Notice: Subject to any disclaimer, the term of this patent is extended or adjusted under 35 U.S.C. 154(b) by 0 days.

(21) Appl. No.: 18/459,703

(22) Filed: Sep. 1, 2023

(65) Prior Publication Data

US 2023/0408910 A1 Dec. 21, 2023

Related U.S. Application Data

(63) Continuation of application No. 17/868,871, filed on Jul. 20, 2022, now Pat. No. 11,774,847, which is a continuation of application No. 17/332,463, filed on May 27, 2021, now Pat. No. 11,422,457, which is a continuation of application No. 16/700,228, filed on Dec. 2, 2019, now Pat. No. 11,054,738.

(30) Foreign Application Priority Data

Dec. 3, 2018 (JP) ................. 2018-226457

(51) Int. Cl.
*G03F 1/64* (2012.01)
*G03F 1/62* (2012.01)

(52) U.S. Cl.
CPC . *G03F 1/64* (2013.01); *G03F 1/62* (2013.01)

(58) Field of Classification Search
CPC ...................................... G03F 1/62; G03F 1/64
USPC ............................................................ 430/5
See application file for complete search history.

(56) References Cited

U.S. PATENT DOCUMENTS

| | | | |
|---|---|---|---|
| 7,750,319 B2 | 7/2010 | Lorusso et al. | |
| 8,192,899 B2 | 6/2012 | Nagata | |
| 9,341,943 B2 | 5/2016 | Horikoshi | |
| 10,649,326 B2 * | 5/2020 | Nishimura | G03F 1/64 |
| 11,054,738 B2 | 7/2021 | Yanase | |
| 11,422,457 B2 | 8/2022 | Yanase | |
| 2006/0115741 A1 | 6/2006 | Kozeki et al. | |
| 2007/0292775 A1 | 12/2007 | Hamada | |
| 2009/0274962 A1 | 11/2009 | Kubota et al. | |
| 2015/0286133 A1 | 10/2015 | Horikoshi | |

FOREIGN PATENT DOCUMENTS

| | | |
|---|---|---|
| JP | 2015-200868 A | 11/2015 |
| WO | WO 2015/045414 A1 | 4/2015 |

OTHER PUBLICATIONS

Extended European Search Report, dated May 6, 2020, for European Application No. 19210268.9.

* cited by examiner

*Primary Examiner* — Christopher G Young
(74) *Attorney, Agent, or Firm* — Birch, Stewart, Kolasch & Birch, LLP

(57) ABSTRACT

A pellicle characterized by having an amount of released aqueous gas of $1\times10^{-3}$ Pa·L/s or less per pellicle, an amount of released hydrocarbon-based gas of $1\times10^{-5}$ Pa·L/s or less per pellicle in a range of measured mass number of 45 to 100 amu, and an amount of released hydrocarbon-based gas of $4\times10^{-7}$ Pa·L/s or less per pellicle in a range of measured mass number of 101 to 200 amu, under vacuum after the pellicle has been left to stand for 10 minutes in an atmosphere of 23° C. and $1\times10^{-3}$ Pa or less.

16 Claims, 2 Drawing Sheets

PELLICLE

CROSS-REFERENCE TO RELATED APPLICATION

This application is a Continuation of application Ser. No. 17/868,871, filed on Jul. 20, 2022, which is a Continuation of application Ser. No. 17/332,463, filed on May 27, 2021 (now U.S. Pat. No. 11,422,457 issued on Aug. 23, 2022), which is a Continuation of application Ser. No. 16/700,228, filed on Dec. 2, 2019 (now U.S. Pat. No. 11,054,738 issued on Jul. 6, 2021), which claims priority under 35 U.S.C. § 119(a) to Application No. 2018-226457, filed in Japan on Dec. 3, 2018, all of which are hereby expressly incorporated by reference into the present application.

TECHNICAL FIELD

The present invention relates to a pellicle to be used as a dust guard when a semiconductor device such as a large scale integrated circuit (LSI) or a very large scale integrated circuit (VLSI), a printed board, a liquid crystal display, or the like is produced.

BACKGROUND ART

In recent years, in design rules of LSI, miniaturization to sub-quarter micron has been promoted, and along with the miniaturization, the wavelength of an exposure light source has been shortened. That is, the exposing light source has shifted from a g-line (436 nm) or i-line (365 nm) by a mercury lamp to a KrF excimer laser (248 nm), an ArF excimer laser (193 nm) or the like, and further, extreme ultra violet (EUV) exposure using an EUV light having a main wavelength of 13.5 nm has been studied.

In the semiconductor production of a LSI, a VLSI or the like, or in the production of a liquid crystal display board, a pattern is formed by irradiating a semiconductor wafer or an original plate for liquid crystal with light, however, if dust adheres to a mask for lithography (simply also referred to as "mask") and a reticle (hereinafter, collectively referred to as an "exposure original plate"), which are used in the above production case, this dust absorbs the light or bends the light, so that there has been a problem that the transferred pattern is deformed or the edge becomes coarse, further the base becomes black and dirty, and the dimension, the quality, the appearance, and the like are impaired.

These works are usually performed in a clean room, however, it is still difficult to keep an exposure original plate clean at all times. Accordingly, a method in which exposure is performed after attaching a pellicle as a dust guard onto a surface of an exposure original plate is generally adopted. In this case, foreign matters do not adhere directly onto the surface of the exposure original plate but adhere onto the pellicle, and therefore, if the focal point is set on a pattern of the exposure original plate during lithography, the foreign matters on the pellicle become irrelevant to the transfer.

As to the basic constitution of the pellicle, a pellicle film having a high transmittance for the light to be used for exposure is stretched on an upper end face of a pellicle frame, and further an airtight gasket is formed on a lower end face of the pellicle frame. In general, a pressure-sensitive adhesive agent layer is used for the airtight gasket. The pellicle film is made of nitrocellulose, cellulose acetate, a fluorine-based polymer or the like, which well transmits the light (a g-line (436 nm) or i-line (365 nm) by a mercury lamp, a KrF excimer laser (248 nm), an ArF excimer laser (193 nm) or the like) to be used for exposure. In recent years, an exposure technique utilizing an EUV laser (13.5 nm) has been developed toward the high integration of a semiconductor device.

In EUV lithography, there has been a problem that the outgas components generated during exposure are adsorbed onto a surface of a reflection mirror or mask in the exposure device, the reflectance is reduced, and the contamination of adsorption of the outgas components onto the inner wall surface of the device is generated. So far, a pellicle, which uses an adhesive agent for a pellicle having a low outgassing property as a mask pressure-sensitive adhesive agent, has been developed (Patent Document 1). However, in fact, it is important to reduce the outgas from the entire pellicle, and for this reason, only the development of the adhesive agent for a pellicle is insufficient as the countermeasure against the outgas of the entire pellicle.

CITATION LIST

Patent Document 1: JP-A 2015-200868

SUMMARY OF THE INVENTION

The present invention has been made in view of such circumstances, and an object of the present invention is to provide a pellicle, with which the outgas generated from the entire pellicle can be reduced as much as possible, and it can be prevented that the outgas components are adsorbed onto a surface of a reflection mirror or mask in an exposure device, the reflectance is reduced, and the contamination of adsorption of the outgas components onto the inner wall surface of the device is generated.

The present inventor has found that by setting the entire pellicle to have an amount of released aqueous gas of $1\times10^{-3}$ Pa·L/s or less per pellicle, an amount of released hydrocarbon-based gas of $1\times10^{-5}$ Pa·L/s or less per pellicle in a range of measured mass number of 45 to 100 amu, and an amount of released hydrocarbon-based gas of $4\times10^{-7}$ Pa·L/s or less per pellicle in a range of measured mass number of 101 to 200 amu, under vacuum after the pellicle has been left to stand for 10 minutes in an atmosphere of ordinary temperature and $1\times10^{-3}$ Pa or less, it can be prevented that the outgas components generated from the entire pellicle are adsorbed onto a surface of a reflection mirror or mask in an exposure device, the reflectance is reduced, and the contamination of adsorption of the outgas components onto the inner wall surface of the device is generated, and thus have completed the present invention.

Therefore, the present invention is to provide the following pellicle.

1. A pellicle, characterized by having an amount of released aqueous gas of $1\times10^{-3}$ Pa·L/s or less per pellicle, an amount of released hydrocarbon-based gas of $1\times10^{-5}$ Pa·L/s or less per pellicle in a range of measured mass number of 45 to 100 amu, and an amount of released hydrocarbon-based gas of $4\times10^{-7}$ Pa·L/s or less per pellicle in a range of measured mass number of 101 to 200 amu, under vacuum after the pellicle being left to stand for 10 minutes in an atmosphere of 23° C. and $1\times10^{-3}$ Pa or less.
2. The pellicle described in the above 1, wherein the pellicle includes a pellicle film and a pellicle frame, and the pellicle film is arranged on an upper end face of the pellicle frame with an adhesive agent or a pressure-sensitive adhesive agent interposed therebetween.

3. The pellicle described in the above 2, wherein the pellicle film is arranged on the upper end face of the pellicle frame, and then the entire pellicle is exposed to heating and reduced pressure.
4. The pellicle described in the above 2 or 3, wherein the pellicle film is arranged on the upper end face of the pellicle frame, and then the entire pellicle is coated with a gas-impermeable film.

Advantageous Effects of the Invention

According to the pellicle of the present invention, the outgas generated from the entire pellicle can be reduced as much as possible, and it can be prevented that the outgas components are adsorbed onto a surface of a reflection mirror or mask in the exposure device, the reflectance is reduced, and the contamination of adsorption of the outgas onto the inner wall surface of the device is generated.

BRIEF DESCRIPTION OF THE DRAWINGS

FIG. 1A is a view as viewed from the lower end face side, FIG. 1B is a view as viewed from the outer face side of the long side, and FIG. 1C is a view as viewed from the outer face side of the short side; FIG. 2A is a view as viewed from the lower end face side, FIG. 2B is a view as viewed from the outer face side of the long side, and FIG. 2C is a view as viewed from the outer face side of the short side.

DESCRIPTION OF THE PREFERRED EMBODIMENT

Figure 1A:
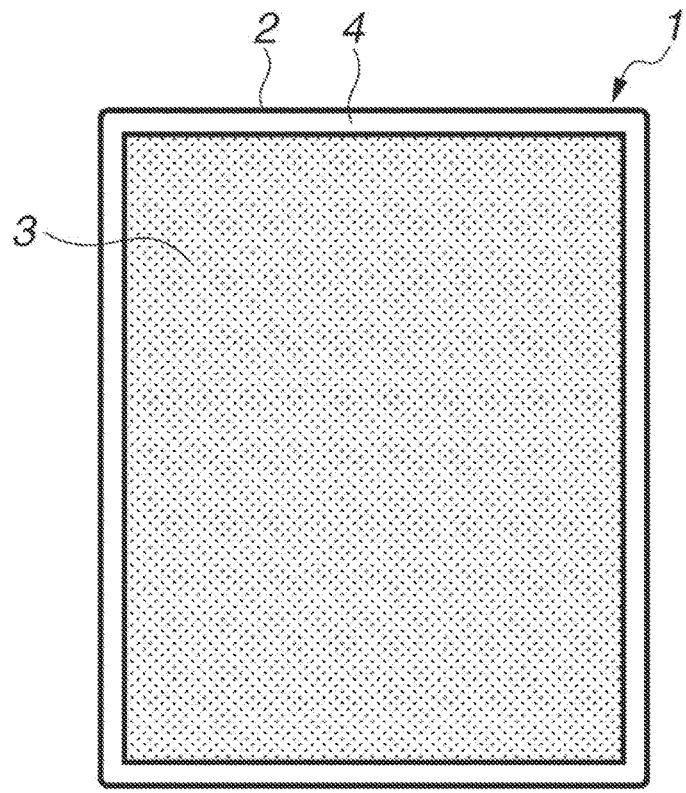
FIGS. 1A to 1C are schematic views (Example) showing one embodiment of the pellicle frame of the present invention.

Hereinafter, the present invention is described in more detail.

The pellicle according to the present invention is not particularly limited in the structure, however, in general, includes a pellicle film, and a pellicle frame.

The pellicle frame corresponds to a shape of a photomask to which the pellicle is to be attached, and generally has a quadrangular frame shape (rectangular frame shape or square frame shape). The material for a pellicle frame is not particularly limited, and a known material can be used. As the material for the pellicle frame, for example, since the pellicle may be exposed to high temperature by EUV exposure, a material with low thermal expansion is preferred, and specifically, quartz, invar, titanium, ceramic, or the like can be mentioned.

In the pellicle frame, a pressure adjustment part may be arranged. By arranging a pressure adjustment part, the pressure difference between the inside and outside of a closed space formed by a pellicle and a photomask can be eliminated, and the pellicle film can be prevented from being swollen or recessed. As to the pressure adjustment part, the part may be prepared by making a through hole in a pellicle frame, or a ventilation part may be arranged between the mask and the frame or between the film and the frame by providing a projection part and a notch part on an end face of the pellicle frame. In the pressure adjustment part, a filter for dust removal may be attached.

A pressure-sensitive adhesive agent can be applied onto a lower end face (mask side) of the pellicle frame. In general, the pressure-sensitive adhesive agent is formed so as to have a width equal to or smaller than the width of the pellicle frame over the entire circumferential direction of an end face of the pellicle frame. In a case where the ventilation part is arranged by providing a notch part on an end face of the pellicle frame, the pressure-sensitive adhesive agent may be arranged only on the projection part. As the pressure-sensitive adhesive agent, a known agent can be used, and for example, an acrylic pressure-sensitive adhesive agent or a silicone-based pressure-sensitive adhesive agent can be suitably used. In particular, from the viewpoint of the heat resistance, a silicone pressure-sensitive adhesive agent is suitably used. The pressure-sensitive adhesive agent to be used for the pellicle frame may be processed into any shape as needed.

In addition, an adhesive agent or a pressure-sensitive adhesive agent can be applied also onto an upper end face (film side) of the pellicle frame. In general, the adhesive agent or the pressure-sensitive adhesive agent is formed so as to have a width equal to or smaller than the width of the pellicle frame over the entire circumferential direction of an end face of the pellicle frame. In a case where a ventilation part is arranged by providing a notch part on an end face of the pellicle frame, the adhesive agent or the pressure-sensitive adhesive agent may be arranged only on the projection part. As the adhesive agent or the pressure-sensitive adhesive agent, a known agent can be used. For example, a silicone-based adhesive agent, a silicone-based pressure-sensitive adhesive agent, or an epoxy-based adhesive agent can be suitably used. In particular, from the viewpoint of the heat resistance, a silicone-based adhesive agent or a silicone-based pressure-sensitive adhesive agent can be suitably used. The adhesive agent or the pressure-sensitive adhesive agent to be used for the pellicle frame may be processed into any shape as needed.

A release layer for protecting a pressure-sensitive adhesive agent may be attached onto a lower end face on the mask side of the pressure-sensitive adhesive agent of the pellicle frame. As the material for the release layer (separator), it is not particularly limited, and for example, polyethylene terephthalate (PET), polytetrafluoroethylene (PTFE), tetrafluoroethylene-perfluoroalkyl vinyl ether copolymer (PFA), polyethylene (PE), polycarbonate (PC), polyvinyl chloride (PVC), polypropylene (PP) or the like can be used. Further, as needed, a release agent such as a silicone-based release agent, or a fluorine-based release agent may be applied onto a surface of the release layer (separator).

The pellicle film is attached to the pellicle frame on the upper end side with an adhesive agent or a pressure-sensitive adhesive agent interposed therebetween. As the material for the pellicle film, it is not particularly limited, and a material having a high transmittance and a high light resistance, at a wavelength of an exposure light source is preferred. For example, an ultrathin silicon film, a carbon film, or the like is used for EUV exposure.

In addition, as the method for stretching the pellicle film on the pellicle frame, it is not particularly limited, and a known method can be used.

Figure 1B:
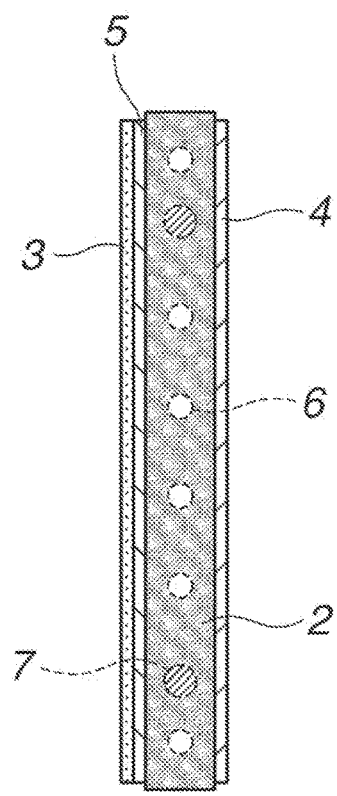
Figure 1C:
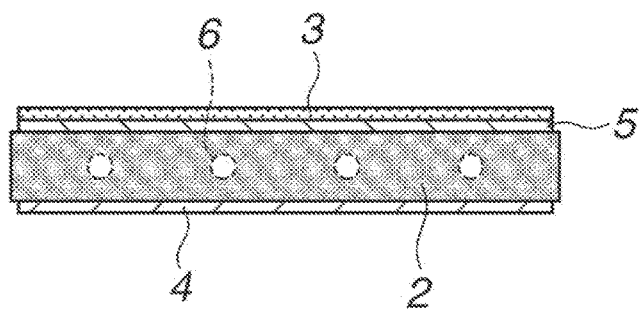
Figure 2A:
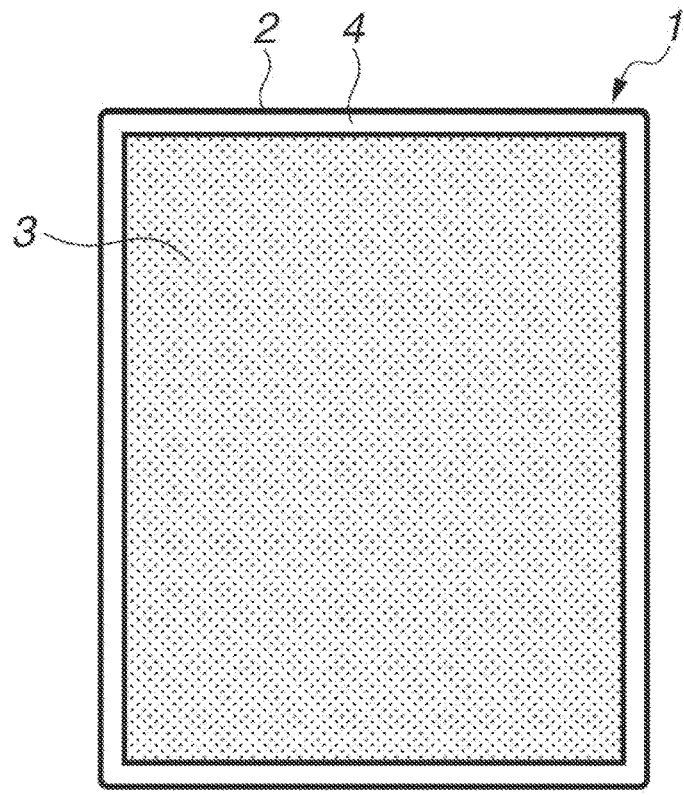
FIGS. 2A to 2C are schematic views showing another embodiment of the pellicle frame of the present invention.
Figure 2B:
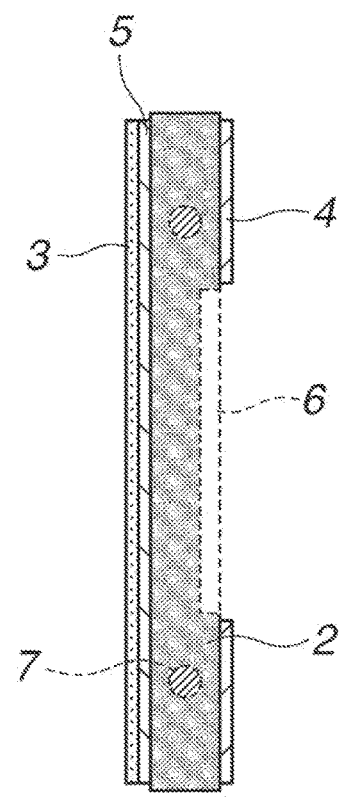
Figure 2C:
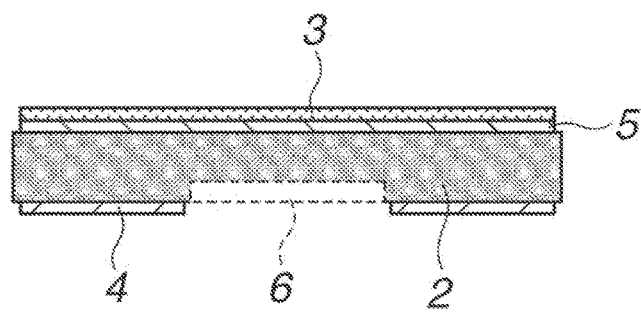

In this regard, FIGS. 1A to 1C and FIGS. 2A to 2C each show one example of the pellicle 1 according to the present invention. A pellicle film 3 is bonded and stretched onto an upper end face of a pellicle frame 2 by an adhesive agent 5. Further, on a lower end face of the pellicle frame 2, a pressure-sensitive adhesive agent 4 to be attached onto a photomask (particularly not shown) is arranged. In addition, in the drawing, the reference sign 6 shows a ventilation part (vent hole), and in the pellicle frame in FIGS. 2A to 2C, a ventilation part (vent hole) is formed so as to form a recess 6 on a lower end face of the pellicle frame unlike in the case of FIGS. 1A to 1C. Further, usually, the reference sign 7 shows a jig hole formed for peeling off a pellicle from a photomask by using a jig.

In the pellicle according to the present invention, an amount of released aqueous gas is $1\times10^{-3}$ Pa·L/s or less per pellicle, an amount of released hydrocarbon-based gas is $1\times10^{-5}$ Pa·L/s or less per pellicle in a range of measured mass number of 45 to 100 amu, and an amount of released hydrocarbon-based gas is $4\times10^{-7}$ Pa·L/s or less per pellicle in a range of measured mass number of 101 to 200 amu, under vacuum after the pellicle has been left to stand for 10 minutes in an atmosphere of ordinary temperature (23° C.) and $1\times10^{-3}$ Pa or less.

In this regard, in the present invention, the completed pellicle is left to stand for 10 minutes under reduced pressure at ordinary temperature in an atmosphere of $1\times10^{-3}$ Pa or less, and then the amount of released gas (Pa/s) is measured. The expression "ordinary temperature" described above means 23° C. Further, as the decompression (vacuum) device, a load-lock type vacuum device, an atmosphere-open type vacuum device including one main chamber, or the like can be mentioned, in particular, a load-lock type vacuum device is suitably adopted. As to the amount of released gas, a pellicle is attached onto a mask, the amount of the gas released from the mask with the pellicle is measured, and further, the amount of the gas released from the mask itself is measured, and from the difference between these amounts of released gas, the amount of the gas released from the pellicle can be calculated.

Further, as to the measurement of the amount of the gas released from the mask with a pellicle or the mask itself, the inside of a chamber of a decompression (vacuum) device is completely sealed after the lapse of 10 minutes from the start of depressurization, and by measuring the return speed of the pressure at the time of sealing, the amount can be calculated as the "amount of released gas under vacuum after being left to stand for 10 minutes" that is referred to in the present invention.

Further, in the present invention, by using a quadrupole-type mass spectrometer, the partial pressure of an amount of released gas under vacuum can be calculated from an ion current value for each range of measured mass numbers. That is, the proportion of aqueous gas (1, 2, 17, and 18 amu), hydrocarbon-based gas (45 to 100 amu), and hydrocarbon-based gas (101 to 200 amu) is calculated from ion current values, and by multiplying the proportion by the total amount of released gas, the amount of released gas of each component can be calculated.

As the above-described quadrupole-type mass spectrometer, a commercially available quadrupole-type mass spectrometer can be used, and for example, "M-201QA-TDM" (product name, manufactured by CANON ANELVA CORPORATION) can be used.

In the measurement of the components of the released gas under vacuum by the above-described quadrupole-type mass spectrometer, as to the measurement conditions under vacuum after being left to stand for 10 minutes in an atmosphere of ordinary temperature and $1\times10^{-3}$ Pa or less, a chamber is sealed for 2 minutes, and then the line between the chamber and a pump is opened, and the ion current in a mass number range of 1 to 200 amu can be measured after the lapse of 13 minutes from the start of depressurization when the pressure is stabilized.

In the present invention, an amount of released aqueous gas is $1\times10^{-3}$ Pa·L/s or less, and preferably $8.5\times10^{-4}$ Pa·L/s or less, per pellicle in a measured mass number of 1, 2, 17, or 18 amu. If the amount exceeds the range, contamination is generated in the chamber. If the amount of released gas is extremely large, the ultimate vacuum may be deteriorated.

In the present invention, an amount of released hydrocarbon-based gas is $1\times10^{-5}$ Pa·L/s or less, and preferably $8.9\times10^{-6}$ Pa·L/s or less, per pellicle in a range of measured mass number of 45 to 100 amu. If the amount exceeds the range, contamination is generated in the chamber. If the amount of released gas is extremely large, the ultimate vacuum may be deteriorated.

In the present invention, an amount of released hydrocarbon-based gas is $4\times10^{-7}$ Pa/s or less, and preferably $3.5\times10^{-6}$ Pa·L/s or less, per pellicle in a range of measured mass number of 101 to 200 amu. If the amount exceeds the range, contamination is generated in the chamber. If the amount of released gas is extremely large, the ultimate vacuum may be deteriorated.

In order to reduce the outgas, which is an object of the present invention, and in order to obtain the pellicle according to the present invention, in which the amount of released gas of each component of aqueous gas and hydrocarbon-based gas satisfies the above-described range under the predetermined conditions as described above, a pellicle having the structure described above is completed, and then the completed pellicle may be subjected to degassing treatment by heating under reduced pressure, or the entire completed pellicle may be coated with a gas-impermeable film such as a SiON film or a metal film. In addition, it is not an essential component in the pellicle according to the present invention to perform the degassing treatment or to arrange the gas impermeable film.

As to the degassing treatment by heating under reduced pressure for the above-described pellicle, specifically, the pellicle can be heated under reduced pressure for 12 hours by using a vacuum device or the like having a heater in the chamber under the conditions of 90° C. and $5\times10^{-2}$ Pa or less.

In a case of coating the pellicle with the above-described gas-impermeable film, for example, when coating a pellicle frame with SiON, by using a plasma chemical vapor deposition (CVD) device, the SiON can be deposited on the entire pellicle so as to have a thickness of 100 nm while controlling a sample temperature to be roughly 50° C. or less and not to reach high temperature.

The pellicle according to the present invention obtained in this way can sufficiently reduce the outgas generated from the entire pellicle, and is useful as a dust guard member when a semiconductor device such as a LSI or a VLSI, a printed board, a liquid crystal display, or the like is produced, the dust guard member can prevent that the outgas components are adsorbed onto a surface of a reflection mirror or mask in an exposure device, the reflectance is reduced, and the contamination of adsorption of the outgas onto the inner wall surface of the device is generated.

EXAMPLES

Hereinafter, the present invention is specifically described by referring to Examples and Comparative Examples, however, the present invention is not limited at all by the following Examples.

Example 1

A pellicle frame (having an outer size of 150×118×1.5 mm and a frame width of 4 mm) made of invar was washed. Into a silicone pressure-sensitive adhesive agent (X-40-3264 manufactured by Shin-Etsu Chemical Co., Ltd.), 0.5 part by weight of catalyst (PL-56 manufactured by Shin-Etsu Chemical Co., Ltd.) was added per 100 parts by weight of the silicone pressure-sensitive adhesive agent to prepare a silicone pressure-sensitive adhesive agent with catalyst. The prepared silicone pressure-sensitive adhesive agent with catalyst was applied onto a lower end face of the pellicle frame. Further, the silicone pressure-sensitive adhesive agent with catalyst was also applied onto an upper end face of the pellicle frame. After that, the pellicle frame was heated under the conditions of 90° C. for 12 hours to cure the silicone pressure-sensitive adhesive agent with catalyst. Subsequently, an ultrathin silicon film was press bonded as a pellicle film to the cured silicone pressure-sensitive adhesive agent with catalyst on the upper end face of the pellicle frame, and a pellicle was completed. The completed pellicle was attached onto a 6-inch chromium mask (hereinafter, referred to as "Cr mask"). The amount of the gas released under vacuum from the pellicle and the presence or absence of the chamber contamination were checked in accordance with the following method.

<Measurement Method of Amount of Released Gas Under Vacuum>

A Cr mask was placed in a load-lock type vacuum device [New SUBARU (facility name) BL-10, University of Hyogo] at ordinary temperature, and the pressure reduction was started. The main body chamber was depressurized in advance so as to be stable at a vacuum degree of $1.0 \times 10^{-3}$ Pa or less, and was transferred from the load-lock chamber to a main body chamber after the lapse of five minutes from the start of depressurization. The chamber was completely sealed for 2 minutes after the lapse of 10 minutes from the start of depressurization. The return speed of the pressure at the time of sealing, that is, the amount of released gas (Pa·L/s) was calculated. The line between the chamber and a pump was opened after the lapse of 12 minutes from the start of depressurization, and the ion current in a mass number range of 1 to 200 amu was measured by a quadrupole-type mass spectrometer ("M-201QA-TDM" manufactured by CANON ANELVA CORPORATION) after the lapse of 13 minutes from the start of depressurization. The proportion of aqueous gas (1, 2, 17, and 18 amu), hydrocarbon-based gas (45 to 100 amu), and hydrocarbon-based gas (101 to 200 amu) was calculated from the obtained ion current values, and by multiplying the proportion by the total amount of released gas, the amount of released gas of each component was calculated.

Subsequently, the amount of released gas of each component of the Cr mask with a pellicle was calculated in the same way, and by subtracting the amount of released gas of each component of only the Cr mask from the above calculated amount, the amount of released gas from the pellicle was calculated.

<Check of Chamber Contamination>

After calculating the amount of released gas of the mask with a pellicle, the amount of released gas of only the Cr mask was measured again, and in a case where the increase by 15% or more was confirmed in at least one of the amounts of released aqueous gas, released hydrocarbon-based gas (45 to 100 amu), and released hydrocarbon-based gas (101 to 200 amu), it was determined that the chamber was contaminated.

Example 2

A pellicle frame (having an outer size of 150×118×1.5 mm and a frame width of 4 mm) made of invar was washed. Into an acrylic pressure-sensitive adhesive agent (SK-1495 manufactured by Soken Chemical & Engineering Co., Ltd.), 0.1 part by weight of curing agent (L-45 manufactured by Soken Chemical & Engineering Co., Ltd.) was added per 100 parts by weight of the acrylic pressure-sensitive adhesive agent to prepare an acrylic pressure-sensitive adhesive agent with curing agent. The acrylic pressure-sensitive adhesive agent with curing agent was applied onto a lower end face of the pellicle frame, and the pellicle frame was heated at 100° C. for 16 hours to cure the acrylic pressure-sensitive adhesive agent with curing agent. Subsequently, into a silicone pressure-sensitive adhesive agent (X-40-3264 manufactured by Shin-Etsu Chemical Co., Ltd.), 0.5 part by weight of catalyst (PL-56 manufactured by Shin-Etsu Chemical Co., Ltd.) was added per 100 parts by weight of the silicone pressure-sensitive adhesive agent to prepare a silicone pressure-sensitive adhesive agent with catalyst. The silicone pressure-sensitive adhesive agent with catalyst was applied onto an upper end face of the pellicle frame, and the pellicle frame was heated at 90° C. for 12 hours to cure the silicone pressure-sensitive adhesive agent with catalyst. After that, the pellicle frame was left to stand in a vacuum evacuation device ("Z106-VAC07" manufactured by Mega Trust Co., Ltd.) at 90° C. and $1.0 \times 10^{-2}$ Pa for 12 hours, and degassing treatment was performed. After the temperature of the pellicle frame was returned to room temperature, an ultrathin silicon film was press bonded as a pellicle film to the silicone pressure-sensitive adhesive agent with catalyst on the upper end face of the pellicle frame, and a pellicle was completed.

The completed pellicle was attached onto a 6-inch Cr mask. The amount of the gas released under vacuum from the pellicle and the presence or absence of the chamber contamination were checked.

Example 3

A pellicle frame (having an outer size of 150×118×1.5 mm and a frame width of 4 mm) made of invar was washed. Into an acrylic pressure-sensitive adhesive agent (SK-1495 manufactured by Soken Chemical & Engineering Co., Ltd.), 0.1 part by weight of curing agent (L-45 manufactured by Soken Chemical & Engineering Co., Ltd.) was added per 100 parts by weight of the acrylic pressure-sensitive adhesive agent to prepare an acrylic pressure-sensitive adhesive agent with curing agent. The acrylic pressure-sensitive adhesive agent with curing agent was applied onto a lower end face of the pellicle frame, the applied acrylic pressure-sensitive adhesive agent with curing agent was flattened, and the flattened acrylic pressure-sensitive adhesive agent with curing agent was heated at 100° C. for 12 hours to cure the acrylic pressure-sensitive adhesive agent with curing agent. Subsequently, into a silicone pressure-sensitive adhesive agent (X-40-3264 manufactured by Shin-Etsu Chemical Co., Ltd.), 0.5 part by weight of catalyst (PL-56 manufactured by Shin-Etsu Chemical Co., Ltd.) was added per 100 parts by weight of the silicone pressure-sensitive adhesive agent to prepare a silicone pressure-sensitive adhesive agent with catalyst. The silicone pressure-sensitive adhesive agent with catalyst was applied onto an upper end face of the pellicle frame, and the applied silicone pressure-sensitive adhesive agent with catalyst was flattened, and the pellicle frame was heated at 90° C. for 12 hours to cure the silicone pressure-sensitive adhesive agent with catalyst. After that, the adhesive face was protected by attaching PET with a release agent to the pressure-sensitive adhesive agents on both end faces of the pellicle frame. After that, by using a chemical vapor deposition (CVD) device, the entire pellicle was coated with a SiON layer. Next, the PET that had protected the adhesive face of the film pressure-sensitive adhesive agent was removed, and then an ultrathin silicon film was press bonded as a pellicle film to the pressure-sensitive adhesive agent on the upper end face of the pellicle frame, and a pellicle was completed. The completed pellicle was attached onto a 6-inch Cr mask. The amount of the gas released under vacuum from the pellicle and the presence or absence of the chamber contamination were checked.

Comparative Example 1

A pellicle frame (having an outer size of 150×118×1.5 mm and a frame width of 4 mm) made of invar was washed, and an epoxy pressure-sensitive adhesive agent (DP-460EG manufactured by 3M Company) was applied onto a lower end face of the pellicle frame. An ultrathin silicon film was attached as a pellicle film onto an upper end face of the pellicle frame, and a Cr mask was attached onto a lower end face of the pellicle frame, the pellicle frame was heated at 150° C. for 2.5 hours to cure the epoxy pressure-sensitive adhesive agent. The amount of the gas released under vacuum from the pellicle and the presence or absence of the chamber contamination were checked.

Comparative Example 2

Comparative Example 2 was performed in a similar manner as in Example 2 except that the degassing treatment by heating under reduced pressure was not performed.

TABLE 1

| | Aqueous gas (Pa/s) | Hydrocarbon-based gas (45 to 100 amu) (Pa/s) | Hydrocarbon-based gas (101 to 200 amu) (Pa/s) | Presence or absence of chamber contamination |
|---|---|---|---|---|
| Example 1 | $5.3 \times 10^{-4}$ | $3.4 \times 10^{-6}$ | $2.0 \times 10^{-7}$ | Absence |
| Example 2 | $8.2 \times 10^{-4}$ | $8.9 \times 10^{-6}$ | $3.5 \times 10^{-7}$ | Absence |
| Example 3 | $6.1 \times 10^{-4}$ | $4.0 \times 10^{-6}$ | $2.7 \times 10^{-7}$ | Absence |
| Comparative Example 1 | $8.4 \times 10^{-3}$ | $4.4 \times 10^{-6}$ | $6.8 \times 10^{-7}$ | Presence |
| Comparative Example 2 | $1.7 \times 10^{-3}$ | $1.2 \times 10^{-5}$ | $2.7 \times 10^{-7}$ | Presence |

As shown in Table 1, in Examples 1 to 3, it was found that the amounts of released gases per pellicle were within the ranges of $1 \times 10-3$ Pa·L/s or less for aqueous gas, $1 \times 10^{-5}$ Pa·L/s or less for hydrocarbon-based gas (45 to 100 amu), and $4 \times 10^{-7}$ Pa·L/s or less for hydrocarbon-based gas (101 to 200 amu), respectively, and the chamber contamination was not generated.

On the other hand, in Comparative Example 1, it was found that the amount of the released hydrocarbon-based gas (45 to 100 amu) exceeded $1 \times 10^{-5}$ Pa·L/s, the amount of the released hydrocarbon-based gas (101 to 200 amu) exceeded $4 \times 10^{-7}$ Pa·L/s, and the chamber was contaminated. In Comparative Example 2, it was found that the amount of the released aqueous gas exceeded $1 \times 10^{-3}$ Pa·L/s and the chamber was contaminated.

Japanese Patent Application No. 2018-226457 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pellicle, comprising a pellicle film and a pellicle frame as essential elements, the pellicle frame having an upper end surface and a lower end surface, the pellicle film disposed on the upper surface of the pellicle frame, and the lower end surface configured to be attached to an exposure original plate, wherein a pressure adjustment part including a ventilation part and having a property applicable to extreme ultra violet (EUV) lithography is arranged so that the pellicle frame has the ventilation part disposed between an end face (film side) of the pellicle frame and the pellicle film, or the ventilation part disposed between the exposure original plate (when the pellicle is attached to the exposure original plate) and an end face (exposure original plate side) of the pellicle frame.

2. The pellicle of claim 1, wherein the pellicle frame has the ventilation part disposed between the end face (film side) of the pellicle frame and the pellicle film, and
the ventilation part comprises a ventilation passage surrounded by a recessed portion provided on the end face (film side) of the pellicle frame and the pellicle film.

3. The pellicle of claim 2, wherein an adhesive agent or a pressure-sensitive adhesive agent arranged only on a projection part of the end face, to which the pellicle film is attached, and the pellicle film.

4. The pellicle of claim 1, wherein the pellicle frame has the ventilation part disposed between the exposure original plate (when the pellicle is attached to the exposure original plate) and the end face (exposure original plate side) of the pellicle frame, and
the ventilation part comprises a ventilation passage surrounded by a recessed portion provided on the end face (exposure original plate side) of the pellicle frame and the exposure original plate.

5. The pellicle of claim 4, wherein an adhesive agent or a pressure-sensitive adhesive agent arranged only on a projection part of the end face, to which the exposure original plate is attached, and the exposure original plate.

6. The pellicle of claim 1, wherein the pressure adjustment part further includes a through hole formed in the pellicle frame.

7. The pellicle of claim 1, wherein the pellicle film has a property applicable to extreme ultra violet (EUV) lithography.

8. The pellicle of claim 1, wherein the pellicle film is a silicon film or a carbon film.

9. The pellicle of claim 1, wherein the material of the pellicle frame is selected from the group consisting of quartz, invar, titanium and ceramic.

10. The pellicle of claim 1, wherein the the pellicle frame has the ventilation part disposed between the end face (film side) of the pellicle frame and the pellicle film,
the ventilation part comprises a ventilation passage surrounded by a recessed portion provided on the end face (film side) of the pellicle frame and the pellicle film,
the pressure adjustment part further includes a through hole formed in the pellicle frame, and
the pellicle film has a property applicable to extreme ultra violet (EUV) lithography.

11. The pellicle of claim 1, wherein the pellicle frame has the ventilation part disposed between the exposure original plate (when the pellicle is attached to the exposure original plate) and the end face (exposure original plate side) of the pellicle frame, the ventilation part comprises a ventilation passage surrounded by a recessed portion provided on the end face (exposure original plate side) of the pellicle frame and the exposure original plate, the pressure adjustment part further includes a through hole formed in the pellicle frame, and the pellicle film has a property applicable to extreme ultra violet (EUV) lithography.

12. The pellicle of claim 1, wherein the the pellicle frame has the ventilation part disposed between the pellicle frame and the pellicle film, the ventilation part comprises a ventilation passage surrounded by a recessed portion provided on the end face (film side) of the pellicle frame and the pellicle film, the pressure adjustment part further includes a through hole formed in the pellicle frame, and the pellicle film is a silicon film or a carbon film, and the material of the pellicle frame is selected from the group consisting of quartz, invar, titanium and ceramic.

13. The pellicle of claim 1, wherein the pellicle frame has the ventilation part disposed between the exposure original plate (when the pellicle is attached to the exposure original plate) and the end face (exposure original plate side) of the pellicle frame, the ventilation part comprises a ventilation passage surrounded by a recessed portion provided on the end face (exposure original plate side) of the pellicle frame and the exposure original plate, the pressure adjustment part further includes a through hole formed on the pellicle frame, and the pellicle film is a silicon film or a carbon film, and the material of the pellicle frame is selected from the group consisting of quartz, invar, titanium and ceramic.

14. An assembly comprising the pellicle of claim 1 and an exposure original plate, wherein the pellicle is attached to the exposure original plate.

15. An exposure method, comprising performing an extreme ultra violet (EUV) exposure, using the assembly according to claim 14.

16. A manufacturing method of a semiconductor device, comprising a step of forming a pattern by irradiating a semiconductor wafer with ultra violet (EUV) exposure wherein the assembly according to claim 14 is adopted.

* * * * *